United States Patent [19]
Embree

[11] Patent Number: 5,838,187
[45] Date of Patent: Nov. 17, 1998

[54] INTEGRATED CIRCUIT THERMAL SHUTDOWN SYSTEM UTILIZING A THERMAL SENSOR

[75] Inventor: Milton Luther Embree, Reading, Pa.

[73] Assignee: Lucent Technologies Inc., Murray Hill, N.J.

[21] Appl. No.: 797,149

[22] Filed: Feb. 10, 1997

[51] Int. Cl.$^6$ .................................................. H03K 5/24
[52] U.S. Cl. ......................................... 327/512; 327/513
[58] Field of Search ..................................... 327/512, 513

[56] References Cited

U.S. PATENT DOCUMENTS

| | | | |
|---|---|---|---|
| 4,197,442 | 4/1980 | Carlsson et al. | 219/10.55 B |
| 4,267,468 | 5/1981 | Hilliker | 307/310 |
| 4,331,888 | 5/1982 | Yamauchi | 340/598 |
| 4,896,199 | 1/1990 | Tsuzuki et al. | 357/28 |
| 5,051,615 | 9/1991 | Rosenthal | 307/350 |
| 5,063,307 | 11/1991 | Zommer | 307/310 |
| 5,336,943 | 8/1994 | Kelly et al. | 307/310 |
| 5,444,219 | 8/1995 | Kelly | 219/505 |

*Primary Examiner*—Toan Tran
*Assistant Examiner*—An T. Luu

[57] ABSTRACT

The specification relates to a thermal shutdown circuit for an integrated circuit. Two matching thermal sensing resistors are used to develop a voltage representing the relative differential temperature between the two resistors. One resistor is fabricated within the integrated circuit dissipating device dielectric isolation tub and therefore its temperature closely follows the temperature of the dissipating device. The second thermal sensing resistor reflects the ambient temperature of the integrated circuit. A third thermal sensing device is used to obtain actual absolute temperature at the location of the second thermal sensing resistor. By algebraically adding a voltage representing actual absolute temperature at an ambient temperature location with a voltage representing the relative differential temperature between thermal sensing resistors, a voltage representing the actual absolute temperature of the dissipating device is produced. The resulting voltage is compared to a reference voltage, the reference voltage representing a high temperature setpoint, so that when the temperature of the dissipating device exceeds the high temperature setpoint, a thermal shutdown signal is actuated.

20 Claims, 1 Drawing Sheet

INTEGRATED CIRCUIT THERMAL SHUTDOWN SYSTEM UTILIZING A THERMAL SENSOR

CROSS REFERENCES TO RELATED APPLICATIONS

This application is related to another U.S. patent application having a filing date of Mar. 18, 1997 and a Ser. No. 08/819,828, entitled "Semiconductor Structure For Thermal Shutdown Protection," (Embree 33–19), having a common inventor and assignee.

FIELD OF THE INVENTION

The present invention relates to the field of integrated circuit design, and more particularly to the design of temperature sensing and thermal protection circuitry within integrated circuits.

BACKGROUND OF THE INVENTION

Thermal shutdown circuits are typically used to protect integrated circuits from damage when a fault is encountered, the most severe of which is commonly an output short circuit. A thermal sensor is located as near as possible to the heat dissipating transistor of the integrated circuit. If the anticipated fault occurs, the dissipating transistor produces excessive heat which is sensed by the thermal sensor. The thermal sensor is incorporated within a thermal shutdown circuit to achieve a desired circuit shutdown.

However, it has always been problematic that a thermal sensor could not be located at the center of the heat dissipating area, especially within dielectrically isolated high voltage integrated circuits. In dielectrically isolated (DI) high voltage devices, such as a double diffused metal oxide semiconductor (DMOS) device, dissipating devices are located within individual tubs formed by several microns of silicon dioxide ($SiO_2$) under and around the device. The thermal resistivity of $SiO_2$ is about one hundred times that of silicon. As a result, for the case of a representative DI silicon integrated circuit (SIC) with the back of the wafer tied to a heat sink, about half of the temperature rise is seen across the $SiO_2$. Therefore, the area adjacent to the dissipating device, where a temperature sensor device is placed, is at less than half of the temperature present in the dielectrically isolated tub. In addition, the high thermal resistance of the $SiO_2$ wall and the high thermal capacity of the surrounding silicon form a thermal delay circuit, which greatly increases the thermal lag characteristic.

One technique used to address this problem is to fabricate a thermal sensor device on a separate chip and then cement or epoxy the thermal sensor to the top of the dissipating device. Active devices, such as diodes or bipolar transistors are preferred because they provide a direct correlation between their absolute temperature (relative to zero degrees Kelvin) and their electrical characteristics. However, such an approach does not totally alleviate the problems associated with inefficient thermal sensing and thermal lag due to epoxy isolation material and further, is much more expensive than a totally monolithic approach.

A second technique used is to design the integrated circuit chip so that the cell that acts as a temperature sensor device is physically located on the chip as close as possible to the dissipating device. Because this distance is generally much greater than would be ideal for such a purpose, the thermal shutdown device must be designed to initiate a thermal shutdown at a relatively low sensed temperature. This approach unnecessarily limits allowable SIC operating ambient temperatures. Also, this technique is characterized by poor shutdown circuit performance, so that full short circuit protection is rarely achieved.

What is needed is a method of determining the actual operating temperature of a dissipating device within an integrated circuit with a high degree of accuracy, to significantly reduce the effects of thermal delay, and to accomplish these goals with as little additional cost as possible.

SUMMARY OF THE INVENTION

The present invention is a thermal shutdown system for an integrated circuit, utilizing a thermal sensor located in the dielectric isolation tub of a dissipating transistor. A resistor is utilized instead of an active device, because placing an active device within the dielectric isolation tub of the dissipating device would cause electrical interactions between the two active devices, and therefore is not a practical solution.

An embodiment of the present invention uses two polysilicon resistors, which can be manufactured with large temperature coefficients, a desirable quality for a thermal sensor. The first resistor is fabricated within the dielectrically isolated tub of the integrated circuit's dissipating device, thereby at thermal equilibrium with that dissipating device. By using a matching polysilicon resistor as a second temperature sensor and monitoring temperature at some remote chip location, a relative temperature difference between the two resistors can be readily obtained. The present invention also uses an active semiconductor device as a temperature sensor, located at approximately the same location as the matching polysilicon resistor. Therefore, an accurate absolute temperature (relative to zero degrees Kelvin) can be determined at the location of the active semiconductor device. By adding that temperature and the relative differential temperature, it is possible to accurately determine the absolute temperature at the dielectric isolation tub of the dissipating device, and therefore an accurate temperature for the dissipating device itself. The temperature at the dielectric isolation tub is characterized as a voltage having a constant component and a component proportional to temperature, and that voltage is compared to a reference voltage selected as the appropriate setpoint for the device. When the setpoint threshold is, traversed, the comparator initiates a shutdown signal.

The resulting circuit determines the actual operating temperature of a dissipating device within an integrated circuit with a high degree of accuracy, significantly reduces the effects of thermal delay associated with conventional temperature protection schemes, and accomplishes this improved thermal protection at less cost than conventional high performance protection schemes. The circuit can be used with practically every integrated circuit requiring fault protection. Some proposed applications would be telephone line drivers, high power operational amplifiers, voltage regulators, motor drivers, and lighting controllers; although the present invention is not limited to use with these illustrative examples.

BRIEF DESCRIPTION OF THE DRAWINGS

A more complete understanding of the present invention may be obtained from consideration of the following description in conjunction with the drawings in which.

DETAILED DESCRIPTION

Figure 1:
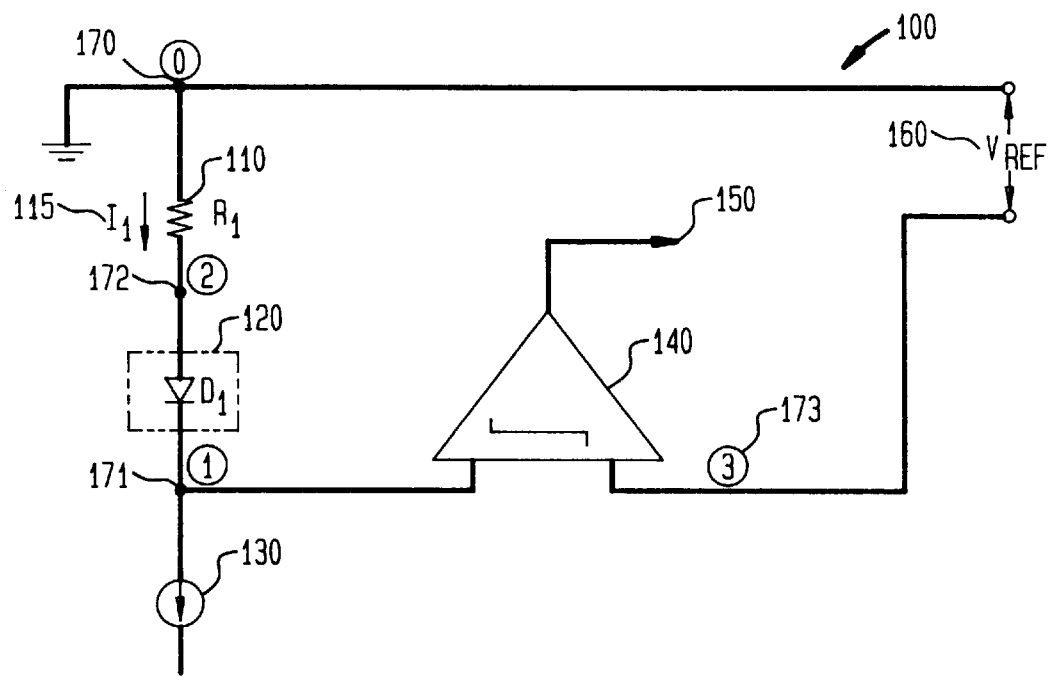
FIG. 1 is a simple schematic of the present invention.

Although the present invention is particularly well suited for use within high voltage and power dissipating silicon integrated circuits, and shall be described so with respect to this application, the present invention may also be applied to any integrated circuit.

One embodiment of the present invention utilizes a polysilicon resistor which is fabricated within the dielectric isolation tub of the integrated circuit's dissipating device. The polysilicon resistor is produced by implanting an impurity, such as boron, within the polysilicon. The polysilicon resistor is located either under the source metal or the drain metal of the device so as to essentially tie the potential of the resistor to the potential of the drain or the source, depending on which configuration is used, thus preventing undesirable voltage swings due to capacitive coupling with fast voltage swing nodes of the high voltage device. A physical design for the fabrication of a polysilicon resistor within the dielectric isolation tub of the dissipating device is disclosed in the related application entitled "Semiconductor Structure For Thermal Shutdown Protection," having a common inventor and a common assignee.

The close physical proximity between the polysilicon resistor and the integrated circuit's dissipating device maintains the temperature of the polysilicon resistor very near that of the dissipating device itself. Since the temperature of the polysilicon resistor is essentially tied to the temperature of the dissipating device, and since the polysilicon resistor has a definable temperature coefficient of resistivity, the resistor may be used as a relative temperature sensor of the integrated circuit's dissipating device.

The present invention describes a circuit utilizing a polysilicon resistor fabricated under the dissipating transistor drain metal, a circuit described as a positive drive thermal shutdown circuit. However, the present invention may also be implemented with a polysilicon resistor fabricated under the source metal, a circuit described as a negative drive thermal shutdown circuit. The two circuits are equivalents; with inverted topologies and identical components, nodes, equations, and circuit analysis. Therefore, the figures and descriptions contained in this application are limited to the implementation of a positive drive thermal shutdown circuit; it being understood that implementation of the circuit as a negative drive thermal shutdown circuit would be apparent to those skilled in the art.

The polysilicon resistors utilized in the present embodiment have a large temperature coefficient of resistivity, approximately negative 0.4 percent per degree Celsius, which is a desirable property. However, manufacturing tolerances for polysilicon resistors within an integrated circuit are quite large, as much as plus or minus thirty percent. As a result, if the polysilicon resistor discussed earlier were used as an absolute temperature sensor, error in temperature detection could be as high as plus or minus seventy-five degrees Celsius. Therefore, the present invention utilizes a second polysilicon resistor and a semiconductor device as two additional temperature sensors to reduce the error in determining the temperature of the dissipating device.

The second polysilicon resistor is fabricated to be a matching resistor to the first polysilicon resistor. That is, the doping concentrations of the polysilicon material and the fabrication processes and methods for the two resistors are the same. Resistance values of the two resistors are not necessarily the same. By locating the second resistor at a location other than the location of the first resistor, the relative temperature difference between the two thermal sensing devices is obtained. It is preferable that the second resistor is located upon the integrated circuit at a location that is at a relatively constant temperature with respect to the temperature of the dissipating devices on the chip. For example, a low temperature location approximating integrated circuit ambient temperature is selected for the second resistor. It is understood that the word "ambient" temperature, when used here and elsewhere within this application, refers to the integrated circuit temperature most representative of the non-heat producing areas of the integrated circuit. Therefore, a reference to a location approximating integrated circuit ambient temperature encompasses any location within the integrated circuit which is thermally non-responsive to temperature changes occurring at the integrated circuit dissipating devices.

The integrated circuit is designed so as to algebraically divide the resistance values representing the sensed temperatures of the two resistors and multiply by a specific voltage to produce a voltage which is equal to a constant plus a value which is proportional to the relative temperature differential between the two resistors. The determined temperature differential is unrelated to manufacturing tolerances, since matching polysilicon resistors are used. Therefore, differential temperature between the resistor located within the tub of the dissipating device and the second resistor is determined with an accuracy about an order of magnitude greater than if the tub located polysilicon resistor attempted to measure absolute tub temperature. However, instead of sensing an absolute temperature at the dielectric isolation tub of the dissipating device, the circuit provides an accurate relative or differential temperature between the dissipating device and the location of the second polysilicon resistor.

The third thermal sensing device utilized in the present invention is fabricated in close physical proximity to the second polysilicon resistor so as to measure the temperature of the second polysilicon resistor. This third thermal sensing device is used to determine an accurate absolute temperature at the location of the second polysilicon resistor. Since an accurate absolute temperature at the second polysilicon resistor is determined with the third thermal sensing device, and an accurate differential temperature between the second polysilicon resistor and the dissipating device tub is achieved utilizing the two polysilicon resistors, an accurate value for the voltage representing the tub absolute temperature is achieved by algebraically summing the voltage corresponding to the absolute temperature and the voltage corresponding to the differential temperature.

The present invention utilizes one or more series connected semiconductor devices as the third thermal sensing device. In one embodiment of the present invention, the one or more series connected semiconductor devices are a plurality of series connected forward biased diodes. In another embodiment of the present invention, one or more diode connected, forward biased bipolar transistors are used. The figures and descriptions contained herein will refer to the third thermal sensing device as diodes and the voltage across these components as diode voltage, although it is understood that alternative circuit implementations using other devices, including diode connected bipolar transistors, would be apparent to those skilled in the art.

Referring to FIG. 1, a thermal shutdown circuit 100 is illustrated with a simplified schematic diagram. $R_1$ 110 is a polysilicon resistor imbedded within the dielectrically isolated tub of an integrated circuit dissipating device, typically a dissipating transistor. The temperature of $R_1$ is approximately equal to the temperature of the dissipating device, due to the proximity of $R_1$ to the dissipating device. $R_1$ is connected between ground at node zero 170 and node two 172. Forward biased diode $D_1$ 120 is connected in series with $R_1$ at node two 172 and attached to node one 171 at its other end. Node one 171 is also connected to one input of a comparator 140. A current source 130 is also connected to node one 171. The current source 130 represents a variable current source which compensates for manufacturing variations in resistor $R_1$. As described earlier, one way to compensate for manufacturing variations in $R_1$ is to use a second temperature sensitive polysilicon resistor in the circuit of current source 130 so that current source 130 current is equal to a constant voltage source potential divided by the value of the second resistance. A specific detailed embodiment will be discussed in more detail when considering FIG. 2.

Again considering FIG. 1, however, $V_{REF}$ 160 is applied to the second input 173 of the comparator 140. $V_{REF}$ 160 is calculated to provide the appropriate temperature setpoint or trip point based on the values chosen for $R_1$ 110, the temperature coefficient of resistivity of $R_1$, the current of current source 130, the forward biased voltage across diode $D_1$ 120, the temperature coefficient of diode $D_1$ and the absolute temperature limit for the integrated circuit dissipating device. The comparator 140 compares voltage at node one 171 to voltage at node three 173. Two different thermal sources, or a combination of both, can therefore result in a thermal shutdown signal. Either the temperature of resistor $R_1$ exceeds the setpoint temperature due to excessive power dissipation of the transistor for which $R_1$ is designed to monitor, or the ambient temperature of the entire integrated circuit chip in which $R_1$ 110 is fabricated exceeds the setpoint temperature. The rate of change of node one 171 voltage with respect to temperature must be the same for both power dissipation, which increases the temperature differential between $R_1$ and diode, and increasing ambient temperature, which increases the temperature of $R_1$ and $D_1$ equally.

As the temperature differential between $R_1$ 110 and diode $D_1$ 120 increases, the absolute value of the negative voltage at the node one 171 input to the comparator 140 decreases and approaches the value of reference voltage, $V_{REF}$ 160 and therefore approaches the thermal shutdown circuit 100 temperature setpoint. Alternatively, as the ambient temperature of the integrated circuit increases, the voltage across diode $D_1$ decreases, which also decreases the absolute value of the voltage at node one 171.

When the voltage at node one 171 is less than $V_{REF}$ 160, the comparator output 150 changes state sending a thermal shutdown signal to the integrated circuit itself, as well as other desired circuits and equipment. When the voltage at node one 171 returns above the trip point because the absolute temperature of $R_1$ has returned to an appropriately low value, the comparator output 150 returns to its original state and removes the thermal shutdown signal. Therefore, the circuit resets itself upon a return to acceptable temperatures.

Figure 2:
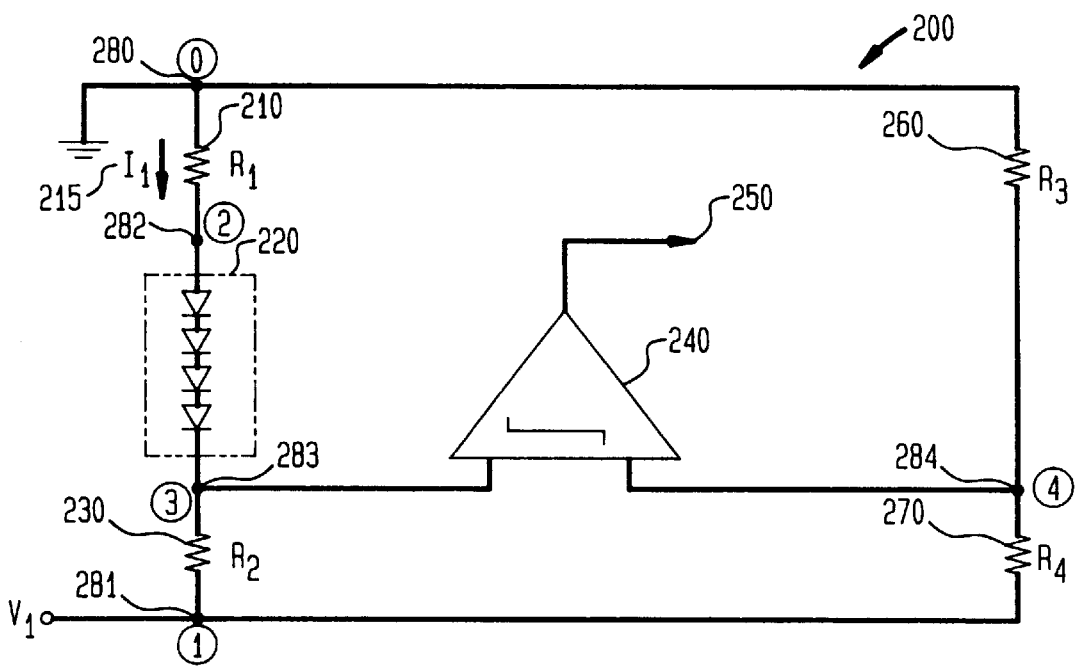
FIG. 2 is a schematic diagram of the present invention illustrating the use of three temperature sensors to accurately identify the absolute tub temperature of the integrated circuit dissipating device.

FIG. 2 is a schematic diagram representing a thermal shutdown circuit utilizing 3 thermal sensing devices, as previously mentioned. Two of the devices are polysilicon resistors and the third device is a semiconductor diode or a group of diodes configured in series. Also as mentioned earlier, one or more diode connected transistors may be used in place of actual diodes.

The first thermal sensing device is $R_1$ 210, a polysilicon resistor fabricated within the dielectrically isolated tub of the integrated circuit dissipating device. The second thermal sensing device is $R_2$ 230, a matching polysilicon resistor located within the integrated circuit at a location distant from $R_1$, so as to closely approximate the integrated circuit ambient temperature. The third thermal sensing device is the diodes 220, located as closely as possible to resistor $R_2$ so that the temperature of the diodes and $R_2$ are approximately equal. Resistors $R_1$ and $R_2$ are electrically connected so that the voltage across $R_1$ is equal to a constant value plus a value proportional to the relative temperature differential between $R_1$ and $R_2$ at the trip point. The voltage across the input of the comparator 240 at the trip point is zero. Since the current $I_1$ 215 at the trip point is equal to the constant voltage across $R_4$ 270 divided by $R_2$, the voltage across $R_1$ is $I_1$ times $R_1$ and by substitution, the voltage across $R_1$ at the trip point is equal to the voltage across $R_4$ times $R_1$ divided by $R_2$. The value of $R_1$ at elevated temperatures is equal to its value at integrated circuit ambient temperature times the quantity one plus the temperature coefficient of $R_1$ times the temperature difference between resistors $R_1$ and $R_2$. As a result, the voltage across $R_1$ is equal to a constant value plus a value which is proportional to the temperature difference between $R_1$ and $R_2$.

Diodes 220 are utilized to determine a voltage equal to a constant value plus a value which is proportional to the absolute temperature at the ambient temperature location of resistor $R_2$. The voltages corresponding to absolute temperature and relative differential temperature are algebraically added and compared to a reference voltage. The circuit therefore determines whether the absolute temperature of resistor $R_1$, and therefore the temperature of the integrate circuit dissipating device, has exceeded its predetermined temperature limit.

Constant voltage source $V_1$ is applied from node one 281 to node zero 280, with node zero 280 grounded and node one 281 at a predetermined constant voltage DC value of $V_1$. Two parallel voltage dividing branches are connected from node zero 280 to node one 281. The first voltage divider consists of $R_1$ connected between node zero 280 and node two 282, the forward biased diodes 220 connected in series between node two 282 and node three 283, and $R_2$ connected between node three 283 and node one 281. The second parallel voltage divider consists of resistors $R_3$ 260 and $R_4$ 270 in series, so that $R_3$ is connected between node zero 280 and node four 284, and $R_4$ is connected between node four 284 and node one 281.

The relationship between resistors $R_3$ and $R_4$ and the value of voltage $V_1$ determines the reference voltage utilized by the comparator 240 and the ratio of resistances of $R_1$ to $R_2$, and along with the forward biased voltage drop of the diodes 220 determines the temperature of the dielectrically isolated tub at which the comparator changes state and a thermal shutdown signal is sent from the comparator output 250. However, for simplicity of circuit analysis of the embodiment of the present invention as illustrated in FIG. 2, $R_3$ and $R_4$ are assumed to be of equal value.

Some key definitions and terms used in the following circuit analysis include:

$R_{1T}$=Value of $R_1$ at tub temperature of dissipating transistor $R_{1C}$=Value of $R_1$ at integrated circuit ambient temperature (condition necessary for no transistor dissipation)

$R_{2C}$=Value of $R_2$ at integrated circuit ambient temperature (condition is always true)

TCR=Temperature coefficient of resistivity of $R_1$ and $R_2$
$V_{F0}$=Forward voltage of one Diode at temperature $T_0$
$V_D$=Voltage across Diodes
TCD=Temperature coefficient of Diode forward voltage
$T_T$=Temperature of the dissipating device tub
$T_C$=Temperature of the chip at location of $R_2$ and Diodes
$T_0$=Reference Temperature; e.g. 25° C.

The voltage divider of $R_3$ and $R_4$ establishes a voltage, $V_4$, at node four 284 of $V_1/2$ VDC. At the comparator 240 trip point, $V_3$, the voltage at node three 283, is also $V_1/2$ VDC. The following equations also apply at the trip point:

$$I_1 R_1 + V_D = I_1 R_2 \quad [1]$$

$$I_1 = (V_3 - V_1)/R_2 = V_1/2R_2 \quad [2]$$

By substitution of [2] into [1]:

$$(V_1 R_1/2R_2) + V_D = V_1/2 \quad [3]$$

The thermal variation of tub resistor $R_1$ 210 with respect to chip temperature is represented by:

$$R_{1T} = R_{1C}[1 + TCR(T_T - T_C)] \quad [4]$$

The thermal variation of diode voltage with respect to the reference temperature is represented by:

$$V_D = 4 V_{F0}[1 + TCD(T_C - T_0)] \quad [5]$$

The coefficient of four times a diode forward voltage is a result of the specific embodiment of the present invention being analyzed, in this case the embodiment as illustrated in FIG. 2, which uses four diodes 220 to implement the semiconductor thermal sensor function. If the number of diodes or diode connected transistors utilized in circuit implementation is different, the coefficient must be adjusted accordingly.

Substituting equations [4] and [5] into equation [3] results in the following defining equation:

$$(R_{1C}/R_{2C})(TCR)(T_T - T_C) + 8(V_{F0}/V_1)(TCD)(T_C - T_0) = (1) - (R_{1C}/R_{2C}) - (8V_{F0}/V_1) \quad [6]$$

As previously stated, the trip point temperature must be independent from the source of heat. That is, the trip point must remain the same regardless of integrated circuit ambient temperature. Therefore, with no transistor dissipation ($T_T - T_C = 0$) or with no integrated circuit ambient temperature rise ($T_C - T_0 = 0$), the trip point remains the same. Thus, in the circuit defining equation [6], the coefficients of ($T_T - T_C$) and ($T_C - T_0$) must be equal.
Therefore:

$$(R_{1C}/R_{2C})(TCR) = 8(V_{F0}/V_1)(TCD)$$

and:

$$R_{1C}/R_{2C} = 8(V_{F0}/V_1)(TCD/TCR) \quad [7]$$

Using equation [7], the circuit designer first chooses a voltage supply, $V_1$, with a low temperature coefficient, and then determines the needed ratio of $R_{1C}$ to $R_{2C}$.

Analysis of the circuit at the trip point demonstrates how the circuit uses two matching resistors as thermal sensors, each with relatively large manufacturing tolerances, and yet protects the integrated circuit with a high degree of accuracy. $V_4$, the voltage at node four 284 is always maintained at half the voltage of $V_1$, the constant voltage source. Therefore at the trip point, $V_3$, the voltage at node three 283 must also be at half the voltage of $V_1$. Current $I_1$ 215 must therefore be equal to one half the voltage of $V_1$ divided by the value of $R_2$. Voltage across thermal sensor $R_1$ equals current $I_1$ times the value of $R_1$. By manipulating the above relationships, the following is true when the circuit is at the trip point:

$$V_2 = (V_1/2)(R_1/R_2)$$

The above equation demonstrates the manner of compensation for the manufacturing tolerances of fabricated thermal sensing resistors in the present invention. For example, suppose $R_1$ and $R_2$ are each 30 percent undervalued. Since the undervalued factor appears in both the numerator and denominator of the controlling equation, the effect of the manufacturing tolerance induced error is eliminated, resulting in a higher degree of accuracy than would otherwise be obtainable.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claims are reserved.

What is claimed is:

1. An integrated circuit incorporating a thermal shutdown circuit protecting an integrated circuit component, comprising:

a thermal sensing device for determining a first voltage corresponding to an integrated circuit ambient temperature;

a first thermal sensing resistor located proximate to said integrated circuit component so that said first thermal sensing resistor temperature approximates said integrated circuit component temperature;

a second thermal sensing resistor located within said integrated circuit such that said second thermal sensing resistor temperature approximates said integrated circuit ambient temperature, said first and second thermal sensing resistors configured to generate a second voltage corresponding to a temperature differential between said integrated circuit ambient temperature and said integrated circuit component temperature; and a comparator comparing the algebraic sum of said first voltage and said second voltage with a reference voltage, said reference voltage corresponding to a temperature limit for said integrated circuit component, and said comparator providing a system shutdown signal when said temperature limit is exceeded.

2. The integrated circuit in accordance with claim 1 wherein said thermal sensing device comprises at least one forward biased diode.

3. The integrated circuit in accordance with claim 1 wherein said thermal sensing device comprises at least one forward biased, diode connected bipolar transistor.

4. The integrated circuit in accordance with claim 1 wherein
said first thermal sensing resistor is fabricated within a dielectrically isolated tub of said integrated circuit component.

5. The integrated circuit in accordance with claim 4 wherein said first thermal sensing resistor is a polysilicon resistor.

6. The integrated circuit in accordance with claim 5 wherein said second thermal sensing resistor is a polysilicon resistor.

7. The integrated circuit in accordance with claim 4 wherein said thermal sensing device comprises at least one forward biased diode.

8. The integrated circuit in accordance with claim 4 wherein said thermal sensing device comprises at least one forward biased, diode connected bipolar transistor.

9. A thermal shutdown circuit fabricated within an integrated circuit, said integrated circuit having a dissipating device surrounded by a dielectrically isolated tub, comprising:
a first thermal sensing resistor fabricated within said dielectrically isolated tub such that said resistor temperature approximates said dissipating device temperature;
at least one thermal sensing semiconductor producing a first voltage representing said integrated circuit ambient temperature;
a second thermal sensing resistor located within said integrated circuit such that said second thermal sensing resistor temperature approximates said integrated circuit ambient temperature;
a voltage dividing network comprising at least said first thermal sensing resistor, said second thermal sensing resistor and a power source, said voltage dividing network configured to produce a second voltage, said second voltage representing a temperature differential between said first thermal sensing resistor and said second thermal sensing resistor; and
a comparator comparing a summation of said first voltage and said second voltage with a reference voltage, said reference voltage corresponding to a temperature limit for said dissipating device, said comparator providing a thermal shutdown signal when said first thermal sensing resistor temperature exceeds said temperature limit.

10. The thermal shutdown circuit in accordance with claim 9 wherein said first thermal sensing resistor is a polysilicon resistor.

11. The thermal shutdown circuit in accordance with claim 10 wherein said polysilicon resistor is a boron doped polysilicon resistor.

12. The thermal shutdown circuit in accordance with claim 10 wherein said polysilicon resistor is physically located under a semiconductor drain metal to form a positive drive thermal shutdown circuit.

13. The thermal shutdown circuit in accordance with claim 10 wherein said polysilicon resistor is physically located under a semiconductor source metal to form a negative drive thermal shutdown circuit.

14. The thermal shutdown circuit in accordance with claim 9 wherein said at least one thermal sensing semiconductor comprises at least one forward biased diode.

15. A thermal shutdown circuit for use within a silicon integrated circuit, said silicon integrated circuit having a dissipating transistor surrounded by a dielectrically isolated tub, comprising:
a first polysilicon resistor having a first end and a second end, said first resistor fabricated within said dielectrically isolated tub such that the temperature of said first resistor approximates the temperature of said dissipating transistor;
at least one diode having a first end and a second end, said at least one diode located within said integrated circuit such that the temperature of said at least one diode approximates the ambient temperature of said integrated circuit;
a second polysilicon resistor having a first end and a second end, said second resistor located within said integrated circuit such that said second resistor temperature approximates said integrated circuit ambient temperature;
said first end of said first polysilicon resistor connected to a first potential, said first end of said at least one diode connected to said second end of said first polysilicon resistor, said second end of said at least one diode connected to said first end of said second polysilicon resistor, and said second end of said second polysilicon resistor connected to a second potential; and
a comparator comparing a reference voltage with a voltage potential located at said second end of said at least one diode, said reference voltage corresponding to a temperature limit for said dissipating transistor, said voltage potential representing said first polysilicon resistor temperature, and said comparator providing an output signal when said first polysilicon resistor temperature exceeds said temperature limit.

16. The thermal shutdown circuit in accordance with claim 15 wherein said first polysilicon resistor is physically located under a semiconductor drain metal to form a positive drive thermal shutdown circuit.

17. The thermal shutdown circuit in accordance with claim 15 wherein said first polysilicon resistor is physically located under a semiconductor source metal to form a negative drive thermal shutdown circuit.

18. The thermal shutdown circuit in accordance with claim 15 wherein said first polysilicon resistor comprises boron doped polysilicon material.

19. The thermal shutdown circuit in accordance with claim 18 wherein said first polysilicon resistor is physically located under semiconductor drain metal to form a positive drive thermal shutdown circuit.

20. The thermal shutdown circuit in accordance with claim 18 wherein said first polysilicon resistor is physically located under semiconductor source metal to form a negative drive thermal shutdown circuit.

* * * * *